(12) United States Patent
Pelletier et al.

(10) Patent No.: US 6,690,150 B2
(45) Date of Patent: Feb. 10, 2004

(54) METHOD AND A SYSTEM FOR PRODUCING A POWER SUPPLY VOLTAGE FOR CONTROLLING AN ELECTRONIC SWITCH

(75) Inventors: Laurence Pelletier, Salornay sur Guye (FR); Alain Delaporte, Aureil (FR)

(73) Assignee: Legrand Legrand SNC, Limoges (FR)

( * ) Notice: Subject to any disclaimer, the term of this patent is extended or adjusted under 35 U.S.C. 154(b) by 2 days.

(21) Appl. No.: 10/041,630

(22) Filed: Jan. 10, 2002

(65) Prior Publication Data

US 2002/0113584 A1 Aug. 22, 2002

(30) Foreign Application Priority Data

Jan. 10, 2001 (FR) .............................. 01 00267

(51) Int. Cl.[7] ................................................ G05F 3/02
(52) U.S. Cl. ...................................................... 323/324
(58) Field of Search ................................ 323/239, 311, 323/324, 349

(56) References Cited

U.S. PATENT DOCUMENTS

| | | | | |
|---|---|---|---|---|
| 3,731,182 A | * | 5/1973 | Hirono et al. ............... | 323/325 |
| 3,885,170 A | * | 5/1975 | Kuzyk ......................... | 327/452 |
| 4,300,090 A | * | 11/1981 | Weber ......................... | 323/311 |
| 4,504,778 A | | 3/1985 | Evans | |
| 4,678,985 A | | 7/1987 | Moskin | |
| 5,239,203 A | * | 8/1993 | Thorngren ................... | 307/116 |
| 5,838,555 A | | 11/1998 | Lejeune et al. | |

FOREIGN PATENT DOCUMENTS

| | | |
|---|---|---|
| EP | 0 031 626 A2 | 7/1981 |
| EP | 0 637 874 A1 | 2/1995 |
| WO | 89/08351 | 9/1989 |

\* cited by examiner

Primary Examiner—Adolf D. Berhane

(57) ABSTRACT

A direct current supply voltage for controlling an electronic switch, for example a triac, is obtained from a residual voltage at the terminals of the switch when it is conducting. The electrical energy needed to produce an auxiliary power supply voltage is taken from the terminals of the electronic switch while it is conducting. The residual voltage is rectified and stepped up, for example using a regulated switch-mode power supply circuit as a rectifier/voltage step-up system.

20 Claims, 1 Drawing Sheet

METHOD AND A SYSTEM FOR PRODUCING A POWER SUPPLY VOLTAGE FOR CONTROLLING AN ELECTRONIC SWITCH

BACKGROUND OF THE INVENTION

1. Field of the Invention

The invention relates to a method and a system for producing a power supply voltage for controlling an electronic switch, for example a triac, more particularly for producing a direct current power supply voltage for supplying power to electronic control circuits when the switch is connected to two wires and controls the supply of power to a load (for example a lamp), i.e. in particular when the switch is connected in series with the load between live and neutral in a single-phase alternating current mains power supply.

2. Description of the Prior Art

In the context indicated above, the electronic switch (the triac) replaces a conventional switch with metal contacts. It is therefore placed with its electronic control circuits in a housing built into the wall, at which only two wires usually terminate, referred to hereinafter for convenience as the "live" wire and the "switched live" wire. The electronic switch is of course connected between the available two wires, i.e. between the live wire and the switched live wire. The load is connected between the switched live wire and the neutral wire, which is not accessible.

A direct current voltage of a few volts, for example 5 volts, is required to power the electronic control circuits of the switch. With the wiring configuration indicated above, this direct current voltage cannot be obtained from the two wires available in the housing built into the wall.

However, the document EP 0 031 626 describes a direct current power supply circuit for controlling a triac which takes the necessary electrical energy from the mains supply via a capacitor and a rectifier circuit. The rectifier circuit can produce a usable direct current voltage only if the triac is turned off. Consequently, the solution proposed in the above prior art document entails interrupting conduction of the triac in each cycle for the short time interval that is needed to produce a direct current voltage that can be used to supply power to the control circuits of the triac.

This kind of solution, which entails periodically creating a "conduction stop" in the control cycle of the triac, generates interference that requires the use of a costly and bulky filter if the system is to conform to the applicable standards.

The invention proposes a different solution, which relies on a residual voltage at the terminals of the switch while it is conducting.

SUMMARY OF THE INVENTION

To be more precise, the invention provides a method of producing an auxiliary power supply voltage for controlling an electronic switch connected in series with a load to a single-phase alternating current mains supply, which method uses a residual voltage drop between the terminals so that the electrical energy needed to produce the auxiliary power supply voltage while the electronic switch is conducting is taken from the terminals of the electronic switch.

In practice, the alternating current residual voltage drop is of the order of one volt. It is therefore advantageous to rectify and step up the residual voltage, for example using a prior art rectifier/voltage step-up circuit. In this way a voltage of the order of 5 volts or more can be obtained, which is perfectly suitable for the direct current power supply of the control circuits of the electronic switch.

If a capacitive component, or even a small electrochemical storage cell, is connected to the output of the rectifier/voltage step-up system, it is possible to maintain a usable voltage when the electronic switch is not conducting (open), and it is therefore possible to control the power circuits of the electronic switch normally when the triac begins to conduct again, i.e. to supply power to the load. However, while the electronic switch is turned off, it is advantageous to produce the auxiliary power supply voltage directly from the mains voltage; this is because, when the electronic switch is turned off (open), the auxiliary power supply voltage can be produced directly from the alternating current mains supply using a simple rectifier circuit connected to the live wire by a capacitor, for example.

The invention also provides an electronic system for controlling an electrical power supply for a load, the system including an electronic switch adapted to be connected in series with the load to supply it with power from a single-phase alternating current mains supply, control means for the switch, and a first auxiliary direct current power supply circuit connected to supply power to the control means, wherein the first auxiliary direct current power supply circuit has an alternating current electrical energy input and the control means are adapted to connect the alternating current electrical energy input to the electronic switch when it is conducting.

As previously mentioned, the first auxiliary power supply circuit preferably includes a rectifier/voltage step-up system, for example a regulated switch-mode power supply.

Integrated circuits specifically designed for rectifier/voltage step-up systems of the indicated type are available off the shelf, for example.

The LINEAR TECHNOLOGY® LT1073-5 integrated circuit is specifically designed for this application, for example.

The above system preferably includes a second direct current auxiliary power supply circuit connected at the input to the alternating current mains supply and adapted to supply power to the control means when the electronic switch is not conducting.

The second auxiliary power supply circuit consists of a simple rectifier connected to the mains supply via a capacitor.

The invention will become more clearly apparent in the light of the following description of an electronic system for controlling the supply of electrical power to a load by means of an alternating current. The description is given by way of example only and refers to the accompanying drawings.

DETAILED DESCRIPTION OF THE PREFERRED EMBODIMENT

Figures 1, 2:
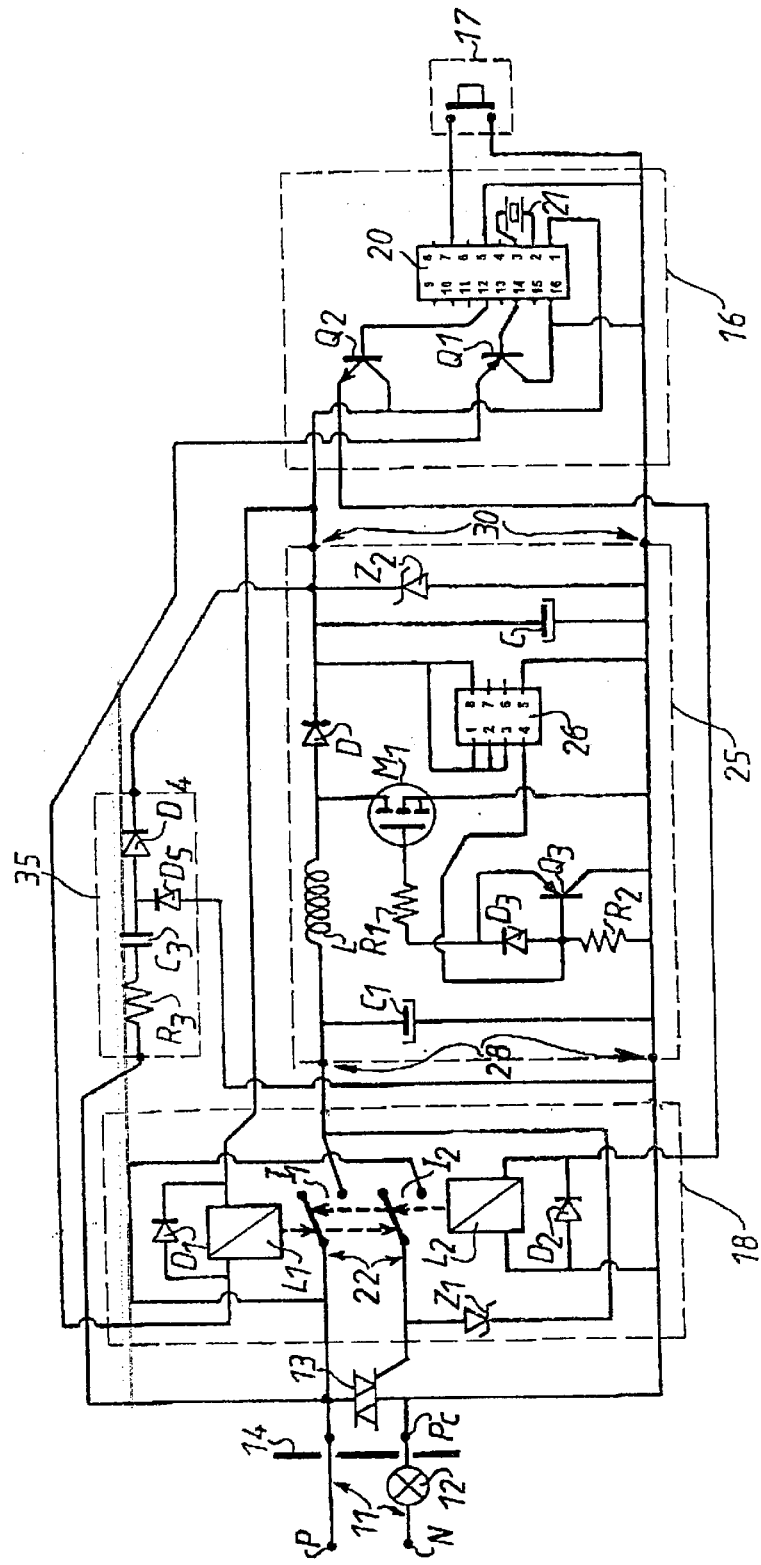
FIG. 1 is a block diagram of the system.
FIG. 2 is a timing diagram showing the alternating current voltage at the terminals of the electronic switch when it is conducting.

FIG. 1 shows a single-phase alternating current mains supply 11, for example equipping premises. A live wire P and a neutral wire N can be seen. A load 12, in this instance a lamp, can be supplied with power from the mains by means of an alternating current. The load can be any electrical appliance designed to be supplied with power by an alternating current.

To this end, an electronic switch 13 is connected in series with the load and the series-connected combination is connected between the live wire P and the neutral wire N. The electronic switch 13 is a triac. At the place where the electronic switch is installed, for example in a housing built into the wall, there are only two wires available, for example the live wire and the switched live wire Pc, as defined previously. The triac 13 is connected between these two wires. The switched live wire is connected to the load 12. The neutral wire N is not directly accessible at the location of the electronic switch.

Controlling the electronic switch 13 necessitates electronic control means requiring a direct current power supply to operate.

In this example, the control means of the triac include a control circuit 16 controlled via a user interface 17 and a connection interface 18 controlled by the control circuit.

The control circuit 16 essentially includes a microcontroller 20, for example an SGS THOMSON® ST6200 8-bit microcontroller. Here it is connected in a conventional manner as recommended by the manufacturer. Its operation necessitates the addition of a quartz crystal 21. It has two logic outputs connected to the bases of two transistors Q1, Q2. The transistor Q1 is a PNP transistor and the transistor Q2 is an NPN transistor. The two transistors control respective coils L1 (set) and L2 (release) of a bistable relay 22 with two switches I1, I2 which constitutes the essential part of the connection interface 18 installed between the triac 13 and a first direct current auxiliary power supply circuit 25, constituting the essential feature of the invention.

In the example described, the user interface 17 is reduced to a simple pushbutton connected between an input of the microcontroller and the switched live wire Pc. Note, however, that the benefit of this type of system is that any type of user interface can be associated with the microcontroller, for example an infrared receiver, an HF reflector, etc.

The direct current voltage available at the output of the first auxiliary power supply circuit 25 supplies power not only to the components of the control circuit 16 but also to the coils of the relay 22. The connection interface is connected as follows: the live wire P is connected to a pole of each switch I1, I2. The trigger of the triac is connected to the other pole of the switch I2.

The first auxiliary power supply circuit 25 has an alternating current electrical energy input 28 in the form of a dipole which is connected to the other pole of the switch I1 and to the switched live wire Pc, i.e. to the accessible conductor connected to the lamp 12.

FIG. 1 clearly shows that the two switches I1, I2 are connected so that in one position (switches I1, I2 open) the live wire P is not connected to the electrical power supply input 28 or to the trigger of the triac 13. In the other position (switches I1, I2 closed), the electrical energy input is connected between the live wire and the switched live wire, i.e. to the terminals of the triac 13, and the live wire is connected to the trigger of the triac.

As previously indicated, the relay 22 is a bistable relay. It is energized only to change its state. Here the relay is a direct current relay. It has two coils: L1 for setting the relay and L2 for releasing it. Energizing the coil L2 releases the relay and opens the two switches I1 and I2. The coil L1 is connected between the direct current voltage output of the first auxiliary power supply circuit and the emitter of the transistor Q1. The coil L2 is connected between the emitter of the transistor Q2 and the switched live wire Pc. A diode D1, D2 shunts each coil L1, L2 to protect it against voltage surges when the transistor Q1, Q2 that controls it is turned off. A Zener diode Z1 is connected between the trigger of the triac and the electrical energy input 28 (with the anode on the trigger side). The function of the Zener diode is to protect the first auxiliary power supply circuit 25. To be more precise, if the switch I1 is closed when the triac is turned off (this constitutes a malfunction) the Zener diode fires the triac, which prevents the alternating current mains supply voltage from being applied to the electrical energy input 28, which would destroy the first auxiliary power supply circuit 25. The latter has an output dipole 30 at the terminals of which a direct current voltage of the order of 5 volts is available for powering the control circuitry of the triac, i.e., in this instance, essentially the relay 22 and the control circuit 16. One pole of the output dipole is connected to the switched live wire.

The first auxiliary power supply circuit 25 is configured as a rectifier/voltage step-up system including an inductor L and a diode D connected in series and a capacitor C shunting the output dipole 30. The above components are connected to an integrated circuit 26, for example an LT 1073 integrated circuit, designed for use in a switch-mode power supply with associated regulator. The inductor L is connected between the input terminal 28 which is connected to the switch I1 and the anode of the diode D. The drain-source junction of an MOS transistor M1 is connected between the common point of the inductor L and the diode D and the switched live wire. Its gate is connected to one end of a resistor R1 whose opposite end is connected to the emitter of a transistor Q3. The collector of the transistor Q3 is connected to the switched live wire. A diode D3 is connected between the collector and the phase of the transistor Q3. A bias resistor R2 is connected between the base of the transistor and the switched live wire. The base of the transistor Q3 is connected to an output of the integrated circuit. The latter is also connected by the output 8 to the cathode of the diode D. The transistor M1 is in fact an external switch used in preference to that provided in the integrated circuit, for improved efficiency. The portion of the circuit including the transistor Q3, the diode D3 and the resistor R2 merely constitutes a system for assisting turning off the transistor M1. A high-capacitance capacitor C1 shunts the input 28 to provide half-wave rectification of the voltage at the terminals of the dipole and to eliminate "HF feedback" to the alternating current mains supply. The direct current auxiliary power supply voltage is available at the terminals of the output dipole 30, i.e. between the cathode of the diode D and the switched live wire. A Zener diode Z2 operating as a voltage limiter shunts the capacitor C. The operation of the auxiliary power supply is described in more detail below.

The auxiliary power supply voltage available at the output dipole 30 powers the control circuit 16 and the relay 22. To be more precise, the cathode of the diode D is connected to the power supply input (input 1) of the microcontroller 20, to the collector of the transistor Q2 and to the coil L1 of the relay 22. The first auxiliary power supply circuit 25 is here designed to produce the auxiliary voltage only when the triac 13 is conducting. When the triac is turned off, the auxiliary voltage is produced by a second auxiliary power supply circuit 35, which is much simpler, and which includes a series-connected branch including a resistor R3, a capacitor C3 and a diode D4. The other terminal of the resistor R3 is connected to the live wire side of the triac 13. The cathode of the diode D4 is connected to the output of the first auxiliary power supply circuit 25, to be more precise to the cathode of the diode D. The cathode of a diode D5 is connected to the common point of the capacitor C3 and the diode D4 and its anode is connected to the switched live wire.

Operation is as follows: when the user commands energization of the lamp 12 via the user interface 17, the control circuit 16 sets the relay 22. The trigger of the triac 13 is energized and the triac conducts. The lamp 12 is energized. It is known that, under these conditions, there is a residual alternating current voltage drop of approximately one volt at the terminals of the triac, as shown in FIG. 2. Because the switch I1 is closed, this residual voltage is also present at the terminals of the input 28. The inductor L is charged via the transistor M1 while the latter is conducting in each switching period. When the transistor is turned off, the energy accumulated in the inductor is transferred to the capacitor C via the diode D. The voltage surge this creates charges the capacitor C to a voltage of the order of 5 volts, which is sufficient to supply power to the control means 16, 18.

When the user turns off the lamp 12 via the user interface 17, the control circuit releases the relay, the switches I1 and I2 open, the triac is turned off, and the auxiliary power supply 25 is neutralized. On the other hand, the charge on the capacitor C is maintained via the second auxiliary power supply circuit 35, which behaves as a rectifier/voltage step-down system which can develop a sufficiently high rectified voltage as soon as the triac 13 is turned off since, under these conditions, the alternating current voltage of the mains supply is available at the input of the auxiliary power supply circuit 35.

What is claimed is:

1. A method of producing an auxiliary power supply voltage for controlling an electronic switch connected in series with a load to a single-phase alternating current mains supply, which method uses a residual voltage drop between terminals of the electronic switch so that the electrical energy needed to produce said auxiliary power supply voltage while said electronic switch is conducting is taken from the terminals of said electronic switch.

2. The method claimed in claim 1 wherein said voltage drop is rectified and stepped up to obtain said auxiliary power supply voltage.

3. The method claimed in claim 1 wherein said auxiliary power supply voltage is produced from the voltage of said mains supply while said electronic switch is turned off.

4. The method of claim 1, wherein the electronic switch is non-conductive when the load is de-energized and is continuously conductive when the load is energized.

5. An electronic system for controlling an electrical power supply for a load, said system including an electronic switch adapted to be connected in series with said load to supply it with power from a single-phase alternating current mains supply, control means for said switch, and a first auxiliary direct current power supply circuit connected to supply power to said control means, wherein said first auxiliary direct current power supply circuit has an alternating current electrical energy input and said control means are adapted to connect said alternating current electrical energy input to said electronic switch when it is conducting.

6. The system claimed in claim 5 wherein said first auxiliary power supply circuit includes a rectifier/voltage step-up system.

7. The system claimed in claim 6 wherein said rectifier/voltage step-up system is a regulated switch-mode power supply.

8. The system claimed in claim 5 wherein said control means include a connection interface between said electronic switch and said alternating current electrical energy input.

9. The system claimed in claim 6 wherein said connection interface includes an electromagnetic relay including a first switch connected between said electrical energy input and said electronic switch.

10. The system claimed in claim 5 wherein said electronic switch is a triac.

11. The system claimed in claim 9 wherein said electronic switch is a triac and said electromagnetic relay includes a second switch connected between said phase and the control electrode of said electronic switch.

12. The system claimed in claim 9 wherein said electromagnetic relay is a bistable relay.

13. The system claimed in claim 12 wherein said electromagnetic relay has two coils respectively energized by two switches forming part of a control circuit which is controlled via a user interface.

14. The system claimed in claim 5 including a second direct current auxiliary power supply circuit with its input connected to said alternating current mains supply and adapted to supply power to said control means when said electronic switch is not conducting.

15. The system claimed in claim 14 wherein said second auxiliary power supply circuit is a rectifier connected to said mains supply via a resistor and a capacitor.

16. The system of claim 4, wherein the electronic switch is non-conductive when the load is de-energized and is continuously conductive when the load is energized.

17. An electronic system for controlling an electrical power supply for a load, comprising:

an electronic switch adapted to be connected in series with a load to supply the load with power from a single-phase alternating current mains supply;

control means connected to said electronic switch; and a first auxiliary direct current power supply circuit connected to supply power to said control means, wherein, said first auxiliary direct current power supply having an alternating current electrical energy input, said control means connect said alternating current electrical energy input to said electronic switch when the switch is conducting, said control means include a connection interface between said electronic switch and said alternating current electrical energy input, and said connection interface includes an electromagnetic relay including a first switch connected between said electrical energy input and said electronic switch.

18. The system claimed in claim 17 wherein said electronic switch is a triac and said electromagnetic relay includes a second switch connected between said phase and the control electrode of said electronic switch.

19. The system claimed in claim 17, wherein said electromagnetic relay is a bistable relay.

20. The system claimed in claim 19, wherein said electromagnetic relay has two coils respectively energized by two switches forming part of a control circuit which is controlled via a user interface.

* * * * *

UNITED STATES PATENT AND TRADEMARK OFFICE
CERTIFICATE OF CORRECTION

PATENT NO. : 6,690,150 B2  
DATED : February 10, 2004  
INVENTOR(S) : Laurence Pelletier et al.

It is certified that error appears in the above-identified patent and that said Letters Patent is hereby corrected as shown below:

<u>Title page,</u>  
Item [73], should read as follows:

-- [73] Assignee: Legrand, Limoges (FR);  
                Legrand SNC, Limoges (FR) --.

Signed and Sealed this

Fourth Day of May, 2004

JON W. DUDAS  
*Acting Director of the United States Patent and Trademark Office*